(12) United States Patent
Wang et al.

(10) Patent No.: US 9,991,070 B2
(45) Date of Patent: Jun. 5, 2018

(54) MULTIPLE FUNCTION SWITCH WITH MECHANICAL FEEDBACK

(71) Applicant: Apple Inc., Cupertino, CA (US)

(72) Inventors: Paul X. Wang, Cupertino, CA (US); Erin M. Lauterbach, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/249,078

(22) Filed: Aug. 26, 2016

(65) Prior Publication Data

US 2017/0084406 A1    Mar. 23, 2017

Related U.S. Application Data

(60) Provisional application No. 62/222,170, filed on Sep. 22, 2015.

(51) Int. Cl.
| | |
|---|---|
| *H01H 13/50* | (2006.01) |
| *H01H 13/14* | (2006.01) |
| *G06F 1/16* | (2006.01) |
| *H01H 13/704* | (2006.01) |
| *H01H 13/705* | (2006.01) |
| *H01H 13/88* | (2006.01) |
| *H05K 5/00* | (2006.01) |

(52) U.S. Cl.
CPC ............. *H01H 13/14* (2013.01); *G06F 1/169* (2013.01); *G06F 1/1662* (2013.01); *H01H 13/503* (2013.01); *H01H 13/704* (2013.01); *H01H 13/705* (2013.01); *H01H 13/88* (2013.01); *H05K 5/0086* (2013.01); *H01H 2215/004* (2013.01); *H01H 2225/018* (2013.01)

(58) Field of Classification Search
CPC ...... H01H 13/48; H01H 13/14; H01H 13/503; H01H 13/64; H01H 2225/01; H01H 2225/018; H01H 2225/02
USPC ................................. 200/406, 1 B, 405, 513
See application file for complete search history.

(56) References Cited

U.S. PATENT DOCUMENTS

| | | | | |
|---|---|---|---|---|
| 4,349,712 A | * | 9/1982 | Michalski ............ | H01H 13/702 200/5 A |
| 4,767,943 A | * | 8/1988 | Adler ..................... | H01H 13/64 200/5 A |
| 5,717,176 A | * | 2/1998 | Dahlstrom ............. | H01H 13/64 200/1 B |
| 6,639,159 B2 | * | 10/2003 | Anzai ................ | H01H 13/7006 200/1 B |
| 7,674,003 B2 | | 3/2010 | Sharrah et al. | |
| 7,902,474 B2 | | 3/2011 | Mittleman et al. | |
| 8,314,352 B2 | * | 11/2012 | Huang .................. | G06F 3/0202 200/1 B |

(Continued)

*Primary Examiner* — Vanessa Girardi
(74) *Attorney, Agent, or Firm* — Dickinson Wright RLLP

(57) ABSTRACT

This application relates to a switch that can include multiple settings for controlling multiple functions of a computing device. The switch can include multiple flexible surfaces that each includes a surface contact. When the switch is depressed, at least one of the flexible surfaces can collapse and close a connection of the switch. When the switch is further depressed, multiple flexible surfaces of the switch can collapse and close multiple connections of the switch. As a result, depending on the amount of force by which the switch is depressed, different functions of a computing device can be controlled by the switch.

20 Claims, 10 Drawing Sheets

(56) References Cited

U.S. PATENT DOCUMENTS

| | | | | |
|---|---|---|---|---|
| 8,735,747 B2* | 5/2014 | Bigand | ............... | H01H 13/64 |
| | | | | 200/1 B |
| 9,012,795 B2 | 4/2015 | Niu | | |
| 2009/0301852 A1* | 12/2009 | Keist | ............... | B60K 37/06 |
| | | | | 200/341 |

* cited by examiner

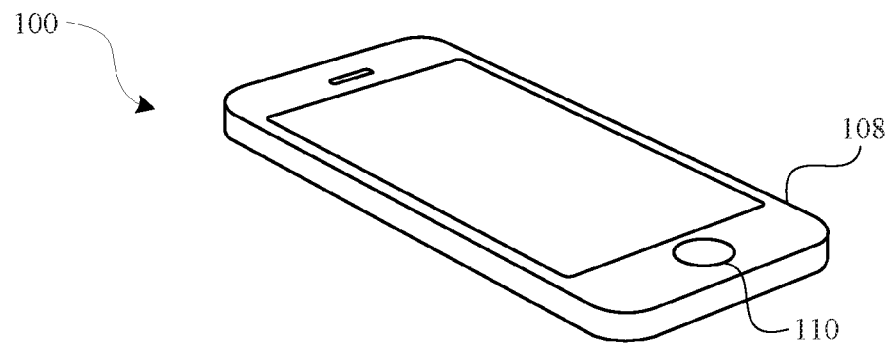
*FIG. 1A*
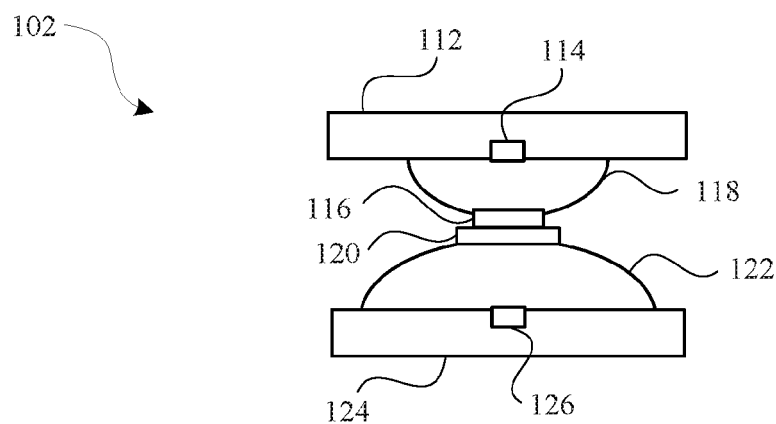
*FIG. 1B*
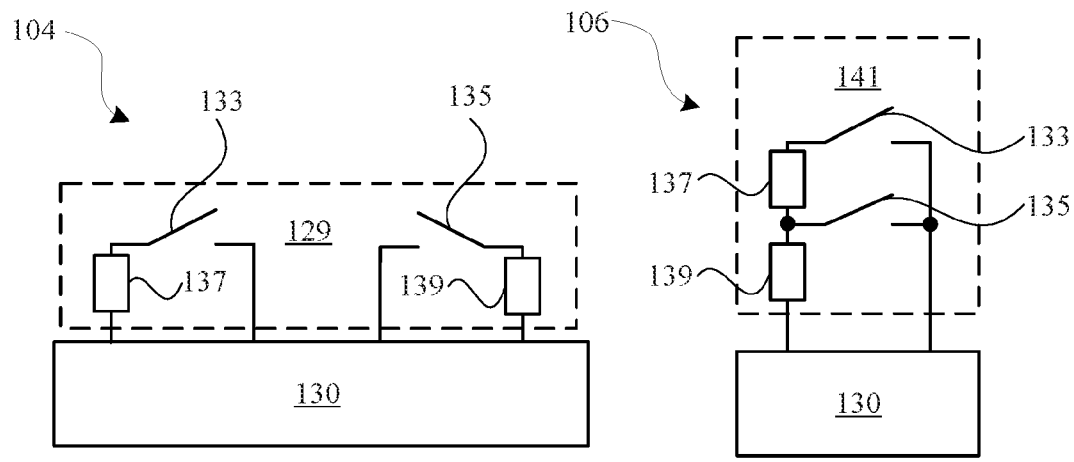
*FIG. 1C*   *FIG. 1D*

MULTIPLE FUNCTION SWITCH WITH MECHANICAL FEEDBACK

CROSS-REFERENCE TO RELATED APPLICATIONS

This application claims the benefit of U.S. Provisional Application No. 62/222,170, filed Sep. 22, 2015, which is incorporated by reference herein in its entirety.

FIELD

The described embodiments relate generally to switches. More particularly, the present embodiments relate to switches that can include multiple settings and provide mechanical feedback when different forces of pressure are applied to the switch.

BACKGROUND

Computing devices incorporate a variety of electrical components that can each provide different functions. However, as the size of many computing devices decreases, available space for different components can also decrease, which can limit the functionality of the computing device. As a result, many users of the computing devices may be required to take additional steps to perform relatively simple functions that could otherwise be controlled using a simple button.

SUMMARY

This paper describes various embodiments that relate to switches that include multiple settings and provide mechanical feedback when different forces of pressure are applied to the switch. In some embodiments, a switch is set forth that includes a switch body that includes at least one terminal contact. The switch can also include at least two flexible surfaces that each include a surface contact that is configured to create a conductive pathway through the at least one terminal contact when the at least two flexible surfaces receive a force of pressure. The at least two flexible surfaces are formed from an elastic material configured to consecutively provide at least two feedback forces to a user when the at least two flexible surfaces are depressed by the user.

In other embodiments, a computing device is set forth. The computing device can include a logic circuit, a housing configured to support the logic circuit, and a switch connected to the logic circuit. The switch can include at least two flexible surfaces that are each configured to collapse at different forces of pressure and cause the logic circuit to perform different functions when each of the at least two flexible surfaces is collapsed. The logic circuit can be connected to a keyboard of the computing device, and the switch can be connected to a key of the keyboard. Additionally, the key can cause the logic circuit to perform at least two different functions based on whether a force of pressure against the key is greater than a first threshold force and a second threshold force.

In yet other embodiments, a system is set forth. The system can include a logic circuit and a switch connected to the logic circuit. The switch can include at least two flexible surfaces configured to each compress at different forces of pressure and create a closed circuit between a set of contacts when each of the different forces of pressure is received. The switch can cause the logic circuit to perform different functions based on which of the different forces of pressure is received at the switch. Furthermore, the set of contacts can include at least two sets of contacts that are configured to be in series.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

FIGS. 1A-1D illustrate various configurations of the switches discussed herein.

DETAILED DESCRIPTION

Figure 2A:
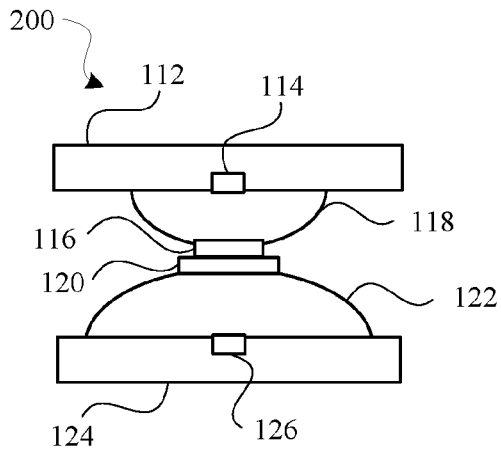
FIGS. 2A-2D illustrate different settings of the switches discussed herein.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

Many computing devices have been designed to be more compact while also increasing functionality of the computing devices. However, when many of the functions rely on physical inputs at switches and buttons, often times many switches and buttons are not incorporated into a device in order to maximize available space within the device. The embodiments set forth herein are provided to consolidate functions into an electrical component and maximize available space within a device. Specifically, in some embodiments, a switch is set forth that includes multiple settings and provides mechanical feedback when different forces of pressure are applied to the switch. The switch can include at least two flexible surfaces that can be compressed individually and in combination in order to control different settings for the switch. For example, a first setting of the switch can be activated when a first force of pressure is applied to the switch and a second setting of the switch can be activated when a second force of pressure, that is greater than the first force of pressure, is applied to the switch. Furthermore, a mechanical and/or electrical feedback response can be provided when the first force of pressure and the second force of pressure are applied to the switch. The mechanical feedback response can result from a buckling or collapsing of one or more of the flexible surfaces incorporated into the switch. In this way, a user that is depressing the switch can determine the setting that has been activated at the switch based on the mechanical feedback provided by the switch in response to activating a setting.

In some embodiments, the switch can include multiple contacts that are connected in series or parallel. Additionally, the switch can be connected to a logic circuit for executing different functions of the logic circuit based on which setting of the switch has been activated. For example, the logic circuit and switch can be connected to a computing device in order to execute different modes of the computing device. In this way, when a first setting of the switch is activated, the logic circuit can cause the computing device to enter a sleep mode, and when a second setting of the switch is activated, the logic circuit can cause the computing device to turn off. In other embodiments, the logic circuit and switch can be connected to a key of a keyboard for a computing device. Because the switch has multiple settings, different signals from the keyboard can be provided based on which setting of the switch is activated. For example, when a first setting of the switch is activated, the key can be associated with the switch can provide a first signal, and when a second setting of the switch is activated, the key associated with the switch can provide a second signal. The first signal can be associated with a lowercase letter, and the second signal can be associated with an uppercase letter. Additionally, in some embodiments, the first signal can be associated with a regular function of the key, and the second signal can be associated with a hidden function of the key. Similarly, the switch and logic circuit can be incorporated into a remote control for a television or other computing device. In this way, the switch can activate a first function of the remote control (e.g., channel change) when the switch is in the first setting, and the switch can activate a second function of the remote control (e.g., a volume change) when the switch is in the second setting. It should be noted that the switch can incorporate any number of flexible surfaces and sets of contacts in order to provide any number of settings for the switch. Furthermore, some of the contacts of the switch can be arranged in series and some of the contacts of the switch can be arranged in parallel.

These and other embodiments are discussed below with reference to FIGS. 1A-6; however, those skilled in the art will readily appreciate that the detailed description given herein with respect to these figures is for explanatory purposes only and should not be construed as limiting.

FIG. 1A illustrates a perspective view of a computing device 108 that can include a switch 110 that is arranged to have multiple different settings to control different functions of the computing device 108. The computing device 108 can be any computing device not limited to a cellular phone, laptop computer, tablet computer, television, desktop computer, media player, remote control, watch, or any other device suitable for incorporating a switch. FIG. 1B illustrates a diagram 102 of a portion of the switch 110. As illustrated in FIG. 1B, the switch 110 can include a first switch plate 112 connected to a first terminal contact 114, and a first flexible surface 118 that is connected to the first switch plate 112 and a first surface contact 116. The switch 110 can also include a second switch plate 124 connected to a second terminal contact 126, and a second flexible surface 122 connected to a second surface contact 120. The switch 110 can operate such that the first terminal contact 114 and the first surface contact 116 touch each other when at least a first amount of pressure is applied to the first switch plate 112. When the first amount of pressure is applied to the first switch plate 112, the first flexible surface 118 can collapse and provide some amount of mechanical energy back to the first switch plate 112. As a result, a user depressing the switch 110 will be able to feel when a setting of the switch 110 has been activated. Furthermore, when at least a second amount of pressure is applied to the switch 110 and causes the second surface contact 120 to contact the second terminal contact 126, another setting of the switch 110 can be activated. Furthermore, when the second amount of pressure is applied to the switch 110, the second flexible surface 122 can collapse and provide some amount of mechanical energy to the first switch plate 112. As a result, a user depressing the switch 110 will be able to feel when the other setting of the switch is activated.

FIG. 1C illustrates a circuit diagram 104 of a switch circuit 129 of the switch 110, which is connected to a logic circuit 130. Specifically, FIG. 1C illustrates how the switch 110 can be arranged and connected to the logic circuit 130. The switch 110 can be connected to the logic circuit 130 in a series arrangement such that different functions of the logic circuit 130 can be controlled using the switch circuit 129. For example, a first function of the logic circuit 130 can be controlled by a first switch 133 and optionally a first component 137 connected to the first switch. A second function of the logic circuit 130 can be controlled by a second switch 135 and optionally a second component 139 connected to the second switch 135. The first switch 133 and the second switch 135 can each correspond to different sets of contacts of the switch 110. The first component 137 and/or the second component 139 can each be one or more electrical components including but not limited to a resistor, capacitor, inductor, switch, sensor, and/or any other component suitable for including in an electrical switch. It should be noted the more than two switches can be incorporated into the switch 110 in order to control more functions of the computing device 100 based on a force applied to the switch 110.

FIG. 1D illustrates a circuit diagram 104 of a switch circuit 141 of the switch 110, which is connected to a logic circuit 130. Specifically, FIG. 1D illustrates how the switch 110 can be arranged and connected to the logic circuit 130. The switch 110 can be connected to the logic circuit 130 in a parallel arrangement such that different functions of the logic circuit 130 can be controlled using the switch circuit 141. For example, a first function of the logic circuit 130 can be controlled by the first switch 133 and optionally the first component 137 connected to the first switch. A second function of the logic circuit 130 can be controlled by the second switch 135 and optionally the second component 139 connected to the second switch 135.

Figure 2B:
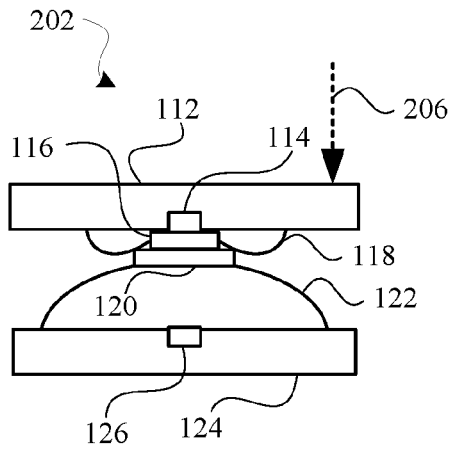
Figure 2C:
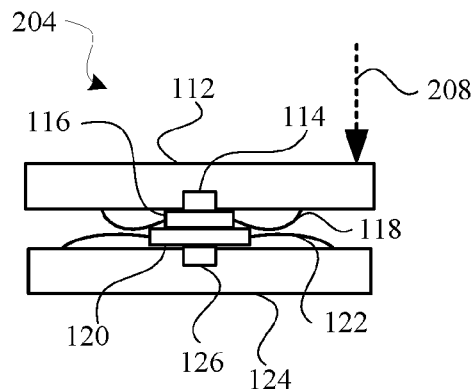

FIG. 2A illustrates a diagram 200 of the switch 110 in a rest position. When in the rest position, the first terminal contact 114 and the first surface contact 116 can be separated, and the second terminal contact 126 and the second surface contact 120 can be separated. The separation of each set of contacts can be in part due to an amount of potential energy associated with each of the first flexible surface 118 and the second flexible surface 122. In this way, a weight of each of the first switch plate 112 or the second switch plate 124 can be arranged to not overcome the potential energy of either of first flexible surface 118 and the second flexible surface 122 without some external force. FIG. 2B illustrates a diagram 202 of the switch 110 being acted on by a first force 206. The switch 110 can be arranged such that the first force 206 can be enough to overcome the potential energy associated with the first flexible surface 118 but not the potential energy associated with the second flexible surface 122. In other words, the first force 206 for collapsing the first flexible surface 118 can be less than a second force 208 for collapsing the second flexible surface 122, as illustrated in the diagram 204 of FIG. 2C. Specifically, FIG. 2C illustrates how a second force 208, that is greater than the first force 206, can collapse both the first flexible surface 118 and the second flexible surface 122 such that the first terminal contact 114 and the first surface contact 116 touch, and the second terminal contact 126 and the second surface contact 120 touch.

By arranging the flexible surfaces in series, the first flexible surface 118 and the second flexible surface 122 can collapse in different orders based on the relative stiffness of the flexible surfaces. For example, the first flexible surface 118 can collapse when the force applied exceeds a first threshold level F1, while the second flexible surface 122 can collapse when the force applied exceeds a second threshold level F2. Depending on the relative value of the first and second threshold levels, the switch 110 can activate the first terminal contact 114 and/or the second terminal contact 126 in different orders, as illustrated in Table 1 below.

Table 1

TABLE 1

| | First Flexible Surface Threshold Level | Second Flexible Surface Threshold Level | Force Applied, F | Activation Result |
|---|---|---|---|---|
| 1 | F1 | F2 > F1 | F < F1 | No Activation |
| 2 | F1 | F2 > F1 | F1 ≤ F < F2 | First terminal contact only |
| 3 | F1 | F2 > F1 | F ≥ F2 | Both first and second terminal contacts |
| 4 | F1 | F2 < F1 | F < F2 | No Activation |
| 5 | F1 | F2 < F1 | F2 ≤ F < F1 | Second terminal contact only |
| 6 | F1 | F2 < F1 | F ≥ F1 | Both first and second terminal contacts |

Figure 2D:
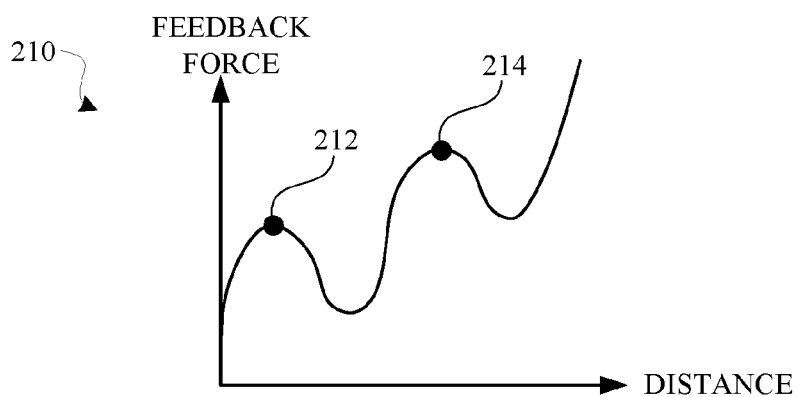

FIG. 2D illustrates a plot 210 of a feedback force that can be received by a user as the switch 110 is depressed over a certain distance. The axes of the plot 210 are "feedback force" and "distance," where feedback force is associated with an amount of mechanical resistance exhibited by the switch 110 as the switch is depressed. The "distance" axis is associated with an amount by which the switch 110 is depressed, as illustrated in FIGS. 2A-2C. A first peak 212 illustrates a point at which the first flexible surface 118 of the switch 110 collapses and a second peak 214 illustrates a point at which the second flexible surface 122 collapses. In this way, a user can feel a certain amount of physical feedback from the switch 110 when each set of contacts of the switch 110 come into contact with each other.

Figure 2E:
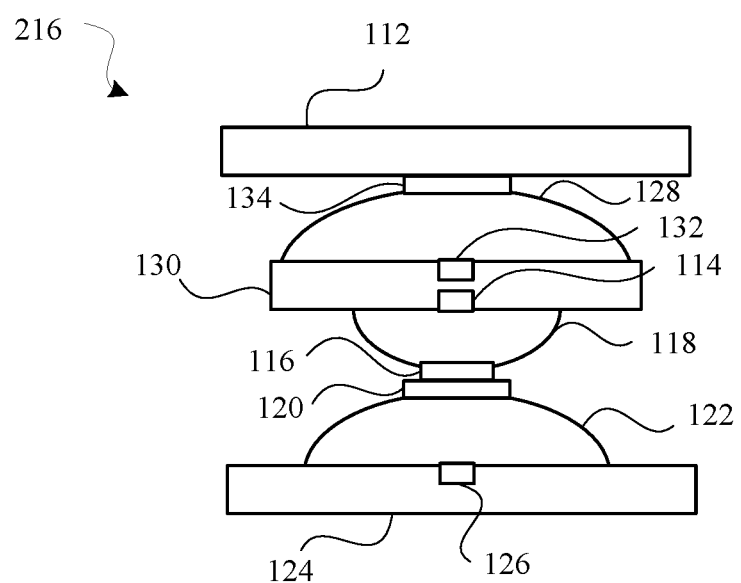
FIG. 2E illustrates an alternative embodiment of a stacked series switch in accordance with the switches discussed herein.

FIG. 2E illustrates a diagram 216 of an alternative embodiment where a third flexible surface 128 and third terminal contact 132 are arranged in a stack, or "in series," with the first flexible surface 118 and second flexible surface 122. In this configuration, the collapsing of the first flexible surface 118 and the second surface 122 can occur in the manner described above. The first force 206 and second force 208 can be enough to overcome the respective potential energy associated with first flexible surface 118 and second flexible surface 122, but not the potential energy associated with the third flexible surface 128. A third force (not shown), that is greater than the first force 206 and the second force 208, can collapse each, the first flexible surface 118, the second flexible surface 122, and third flexible surface 128 such that (i) the first terminal contact 114 and the first surface contact 116 touch, (ii) the second terminal contact 126 and the second surface contact 120 touch, and (iii) a third terminal contact 132 and third surface contact 134 touch. Other embodiments are also possible with more than three flexible surfaces stacked in series in a similar manner as described herein.

Figure 2F:
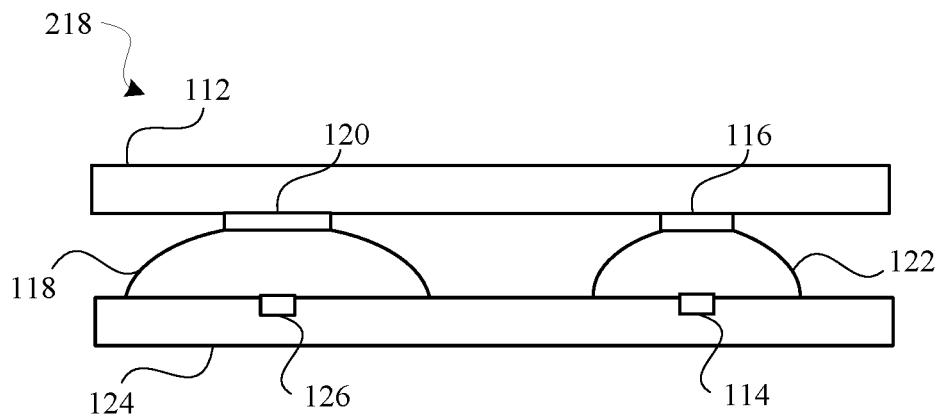
FIGS. 2F-2H illustrate an alternative embodiment of a parallel switch in accordance with the switches discussed herein.
Figure 2G:
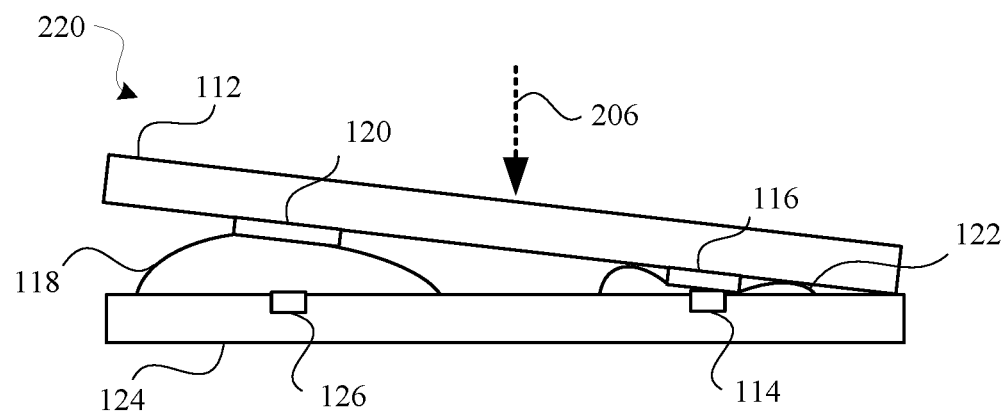
Figure 2H:
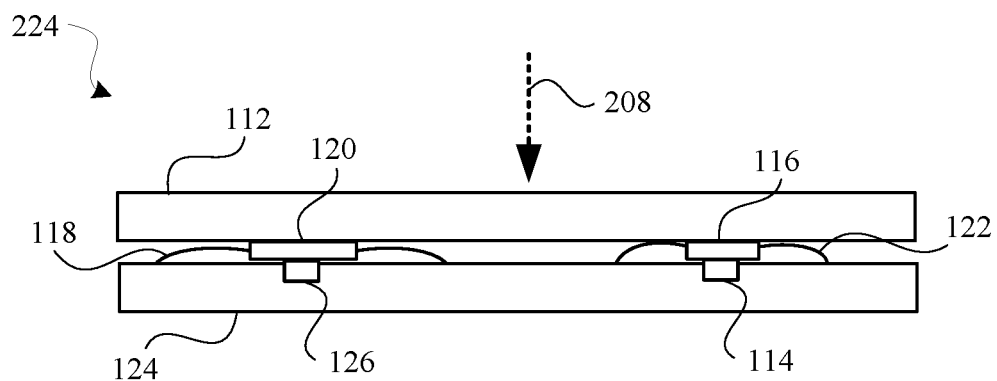

FIG. 2F illustrates a diagram 218 of an alternative embodiment where the terminal contacts and flexible surfaces are arranged in parallel. When in the rest position, as shown in FIG. 2F, the first terminal contact 114 and the first surface contact 116 can be separated, and the second terminal contact 126 and the second surface contact 120 can be separated. FIG. 2G illustrates a diagram 220 of the switch 110 being acted on by a first force 206. The switch 110 can be arranged such that the first force 206 can be enough to overcome the potential energy associated with the first flexible surface 118 but not the potential energy associated with the second flexible surface 122. In other words, the first force 206 for collapsing the first flexible surface 118 can be less than a second force 208 for collapsing the second flexible surface 122, as illustrated in the diagram 204 of FIG. 2H. In this way, the first switch plate 112 cantilevers, allowing the first surface contact 116 to touch the first terminal contact 114 and providing the first a feedback force. FIG. 2H, illustrates a diagram 224 of how a second force 208, that is greater than the first force 206, can collapse both the first flexible surface 118 and the second flexible surface 122 such that the first terminal contact 114 and the first surface contact 116 touch, and the second terminal contact 126 and the second surface contact 120 touch.

Figure 2I:
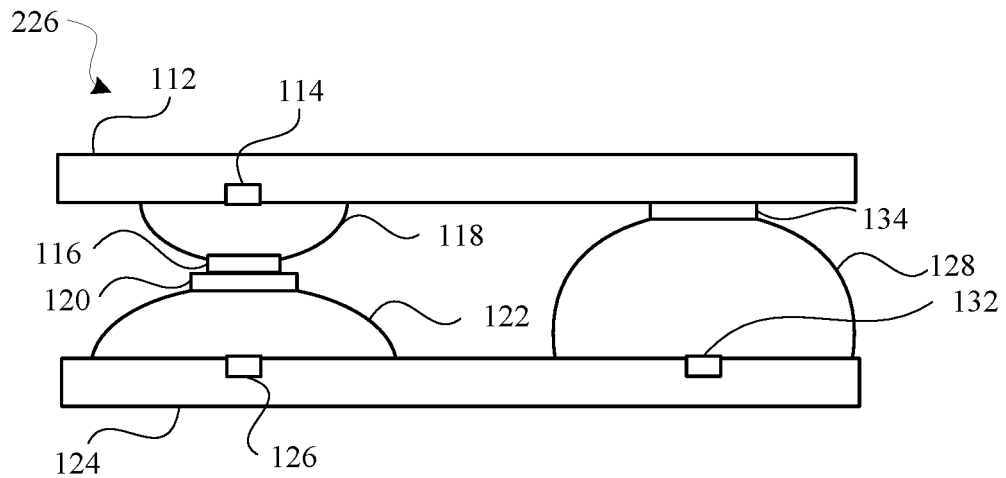
FIGS. 2I-2K illustrate an alternative embodiment of a parallel and in series switch in accordance with the switches discussed herein.
Figure 2J:
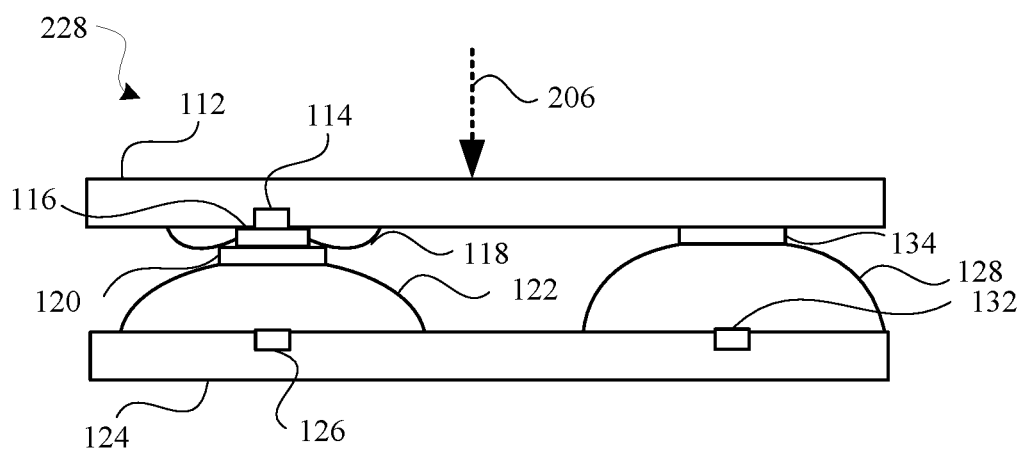
Figure 2K:
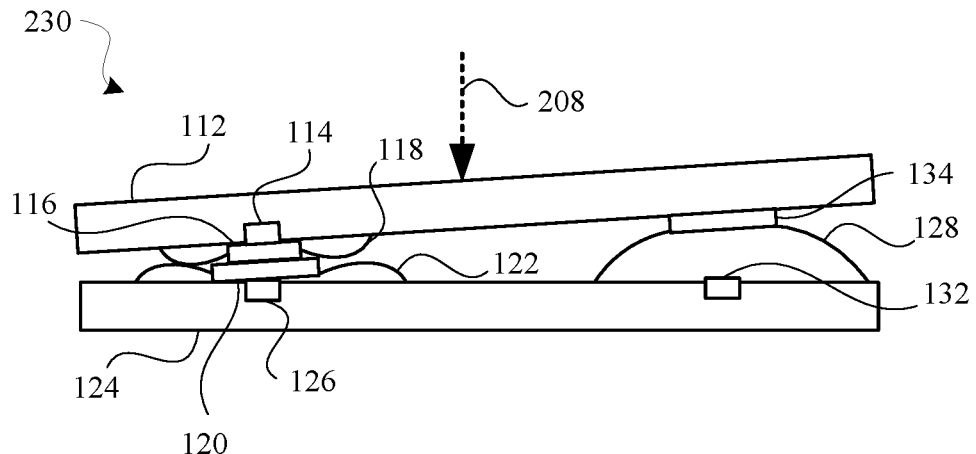

FIG. 2I illustrates a diagram 226 of an alternative embodiment where the terminal contacts and flexible surfaces are arranged in parallel and in series. FIG. 2I illustrates the switch at rest. In this configuration, the collapsing of the first flexible surface 118 and the second surface 122 can occur in any manner as described above in FIGS. 2A-2H. As illustrated in FIG. 2J showing diagram 228, the first force 206 can be enough to overcome the respective potential energy associated with first flexible surface 118, but not the potential energy associated with the and second flexible surface 122 and third flexible surface 128. As illustrated in FIG. 2K showing diagram 230, the second force 208 can be enough to overcome the respective potential energy associated with first flexible surface 118 and second flexible surface 122, but not the potential energy associated with the third flexible surface 128. In a final fully compressed position, (not shown, a third force, that is greater than the first force 206 and the second force 208, can collapse each, the first flexible surface 118, the second flexible surface 122, and third flexible surface 128 such that (i) the first terminal contact 114 and the first surface contact 116 touch, (ii) the second terminal contact 126 and the second surface contact 120 touch, and (iii) a third terminal contact 132 and third surface contact 134 touch. Other arrangements and embodiments are also possible with various flexible surfaces stacked in series and/or in parallel in similar manners as described herein, for example, as illustrated in FIG. 2L.

Figure 2L:
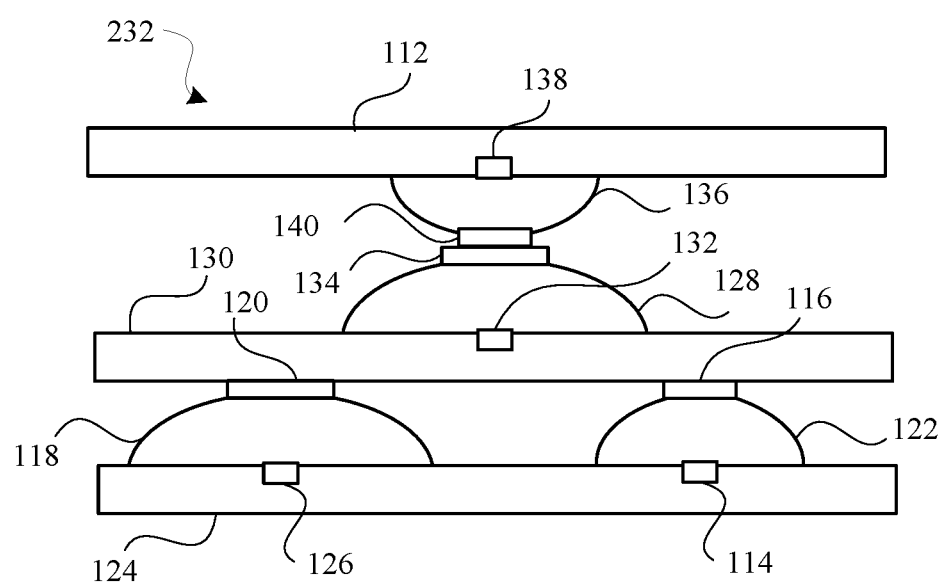
FIG. 2L illustrates an alternative embodiment of a parallel and in series switch in accordance with the switches discussed herein.

FIG. 2L illustrates a diagram 232 of an alternative embodiment where the terminal contacts and flexible surfaces are arranged in parallel and in series. Here a fourth flexible surface 136, aligned with a fourth terminal contact 138 and fourth contact surface 140, is in series with flexible surface third flexible surface 128, the combination of which is in series with the combination of first flexible surface 118 and second flexible surface 122. Like the previous examples each flexible surface can be tuned so that each compresses under different forces allowing for multiple feedback forces and multiple signals generated by the touching of the contact surface with the respective terminals.

Figure 3A:
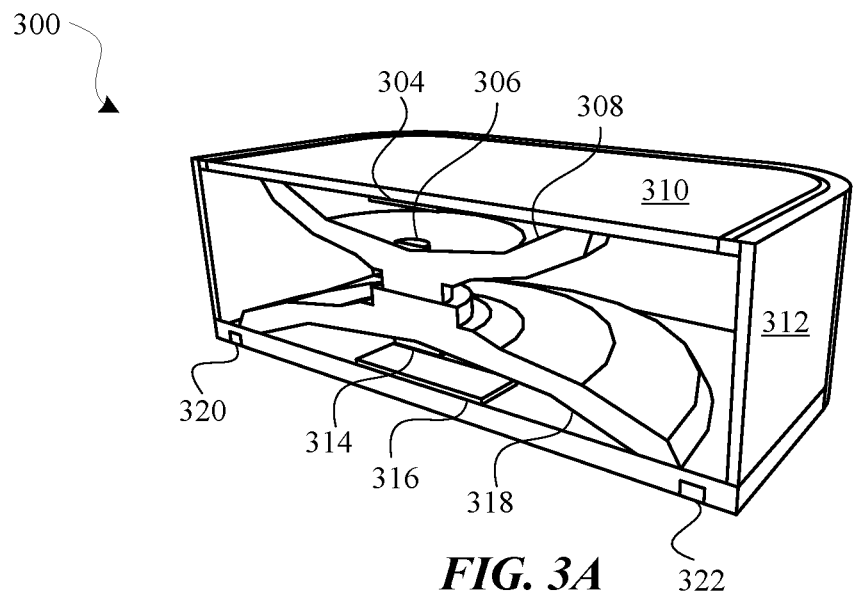
FIGS. 3A-3B illustrate various views of the switches discussed herein.
Figure 3B:
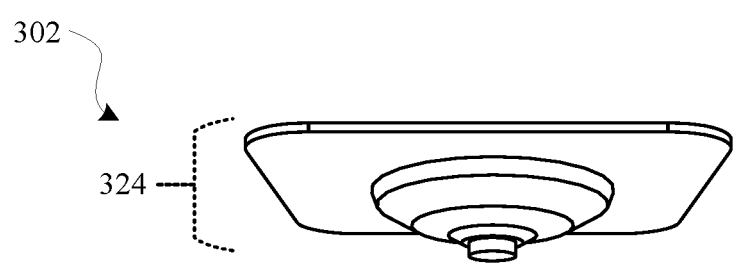
Figure 3B:
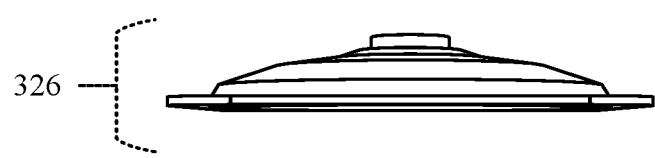
Figure 3B:
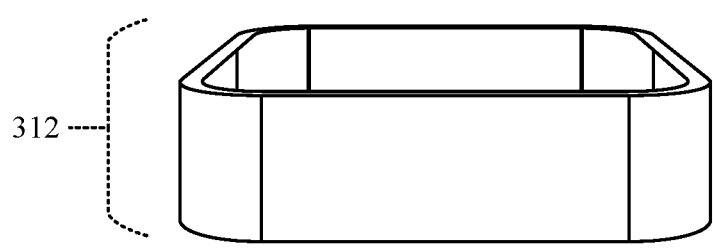

FIG. 3A illustrates a cross-sectional view 300 of a switch according to some embodiments. The switch can include a switch body 312 that encloses and supports a first flexible surface 308 that is connected to a first surface contact 306, and a second flexible surface 318 that is connected to a second surface contact 314. When a top 310 of the switch is depressed or receives some force of pressure, the first flexible surface 308 will collapse and cause the first surface contact 306 and the first terminal contact 304 to touch. As the force of pressure increases, the second flexible surface 318 can collapse and cause the second surface contact 314 and the second terminal contact 316 to touch. The first flexible surface 308 and the second flexible surface 318 can be made from the same or different materials, including, but not limited to, plastic, metal, elastic, and/or any material suitable for creating a flexible surface. The flexible surfaces can include conductive material that allows one or more closed circuits to be created when each surface contact touches a terminal contact. FIG. 3B illustrates an exploded view 302 of a portion of the switch according to some embodiments. The switch can include a first button assembly 324, which can include a surface contact disposed at least partially within a first flexible surface of the first button assembly 324. The switch can also include a second button assembly 326, which can include a surface contact disposed at least partially within a second flexible surface of the second button assembly 326. Each of the first button assembly 324 and the second button assembly 326 can be included in a switch body 328, which can enclose and support both the first button assembly 324 and the second button assembly 326.

Figure 4A:
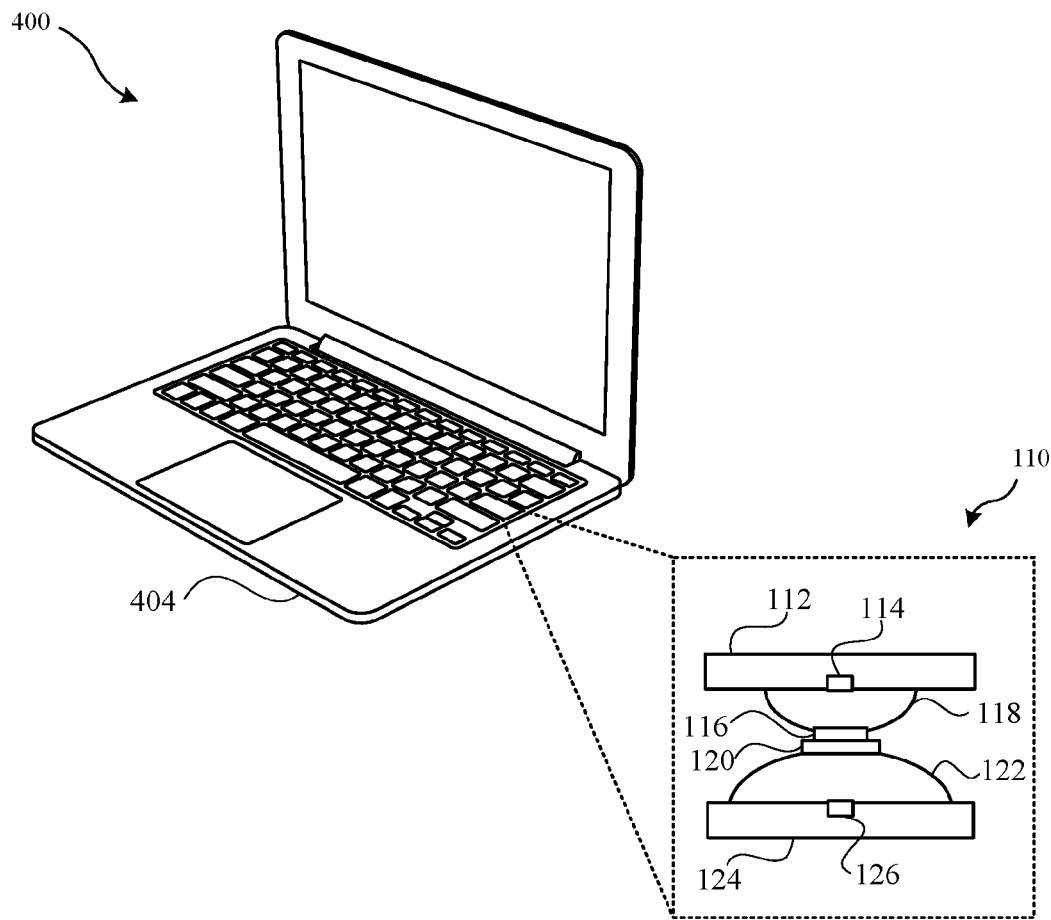
FIG. 4A illustrates an embodiment of a switch included in a laptop computing device.

FIG. 4A illustrates a perspective view 400 of a laptop 404 that can include the switch 110 discussed herein. Because the switch 110 can be operate in more than one configuration or setting, the switch 110 can control multiple functions of the laptop with a single key. For example, in some embodiments, the switch 110 can be connected to a letter key and cause a lowercase letter input to be entered at the laptop 404 when the first terminal contact 114 touches the first surface contact 116. Additionally, when the second terminal contact 126 touches the second surface contact 120, the switch 110 can cause an uppercase letter input to be entered at the laptop 404. In this way, keys that would normally be used to create an uppercase letter, such as a "shift key" or a "function key," can be eliminated from the keyboard of the laptop 404 or an external keyboard, thereby creating more space on the keyboard.

Figure 4B:
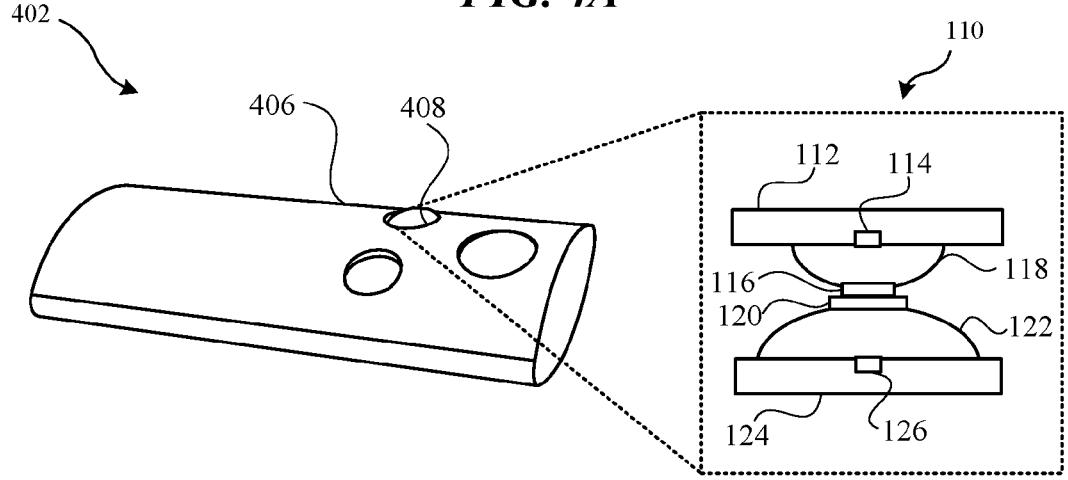
FIG. 4B illustrates an embodiment of a switch included in a remote control that can control a computing device.

FIG. 4B illustrates a perspective view 402 of a remote control 406 that can include the switch 110 discussed herein. The remote control 406 can include a button 408, which can be connected to the switch 110. In this way, the button 408 is able to perform multiple functions. For example, in some embodiments, the switch 110 can be connected to a logic circuit for controlling a channel position and volume level for a device that the remote control 406 is controlling. In this way, when the first terminal contact 114 and the first surface contact 116 touch, a channel position can be adjusted, and when the second terminal contact 126 and the second surface contact 120 touch, a volume level can be adjusted. As a result, less buttons can be included on the remote control 406, allowing the remote control 406 to be more compact and portable.

Figure 5:
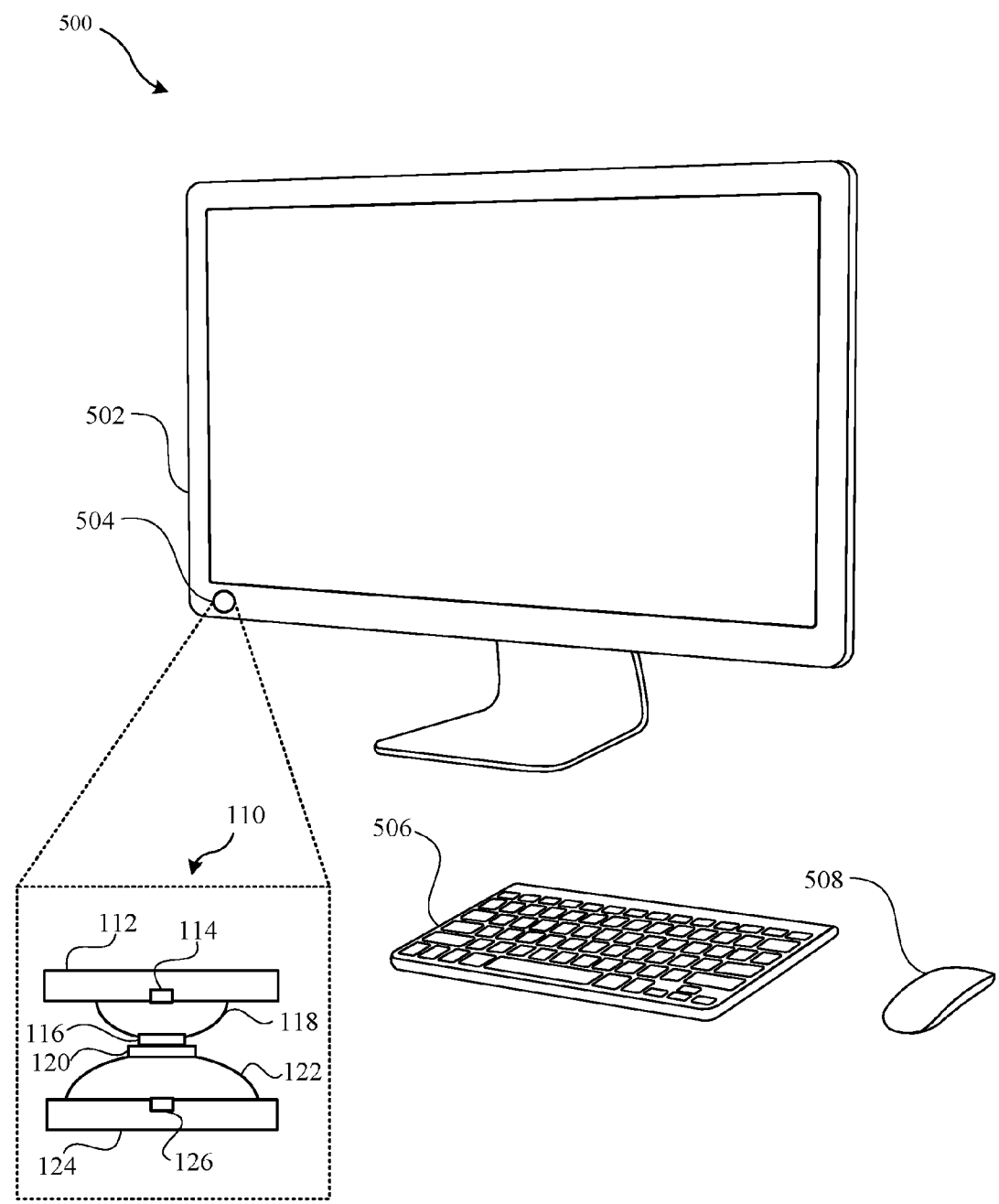
FIG. 5 illustrates an embodiment of a switch included in different devices of a computer system.

FIG. 5 illustrates a perspective view 500 of a computing system that includes a computing device 502, a keyboard 506, and a mouse or track pad 508 that can each include the switch 110. For example, the computing device 502 can include a power button 504 that is connected to the switch 110. The switch 110 can therefore control multiple functions of the computing device 502 via the power button 504. For example, when the first terminal contact 114 and the first surface contact 116 touch as a result of pressing the power button 504, a sleep mode can be initiated at the computing device 502, and when the second terminal contact 126 and the second surface contact 120 touch, the computing device 502 can be powered off or powered on. The keyboard 506 can also include the switch 110, as discussed with respect to FIG. 4A. The mouse or track pad 508 can include the switch 110 in order to control different functions of the computing device 502. For example, when the first terminal contact 114 and the first surface contact 116 touch, a function associated with a single click can be executed at the computing device 502, and when the second terminal contact 126 and the second surface contact 120 touch, a function associated with a double click can be executed at the computing device 502. The function associated with each different click and switch 110 setting can be user configurable.

Figure 6:
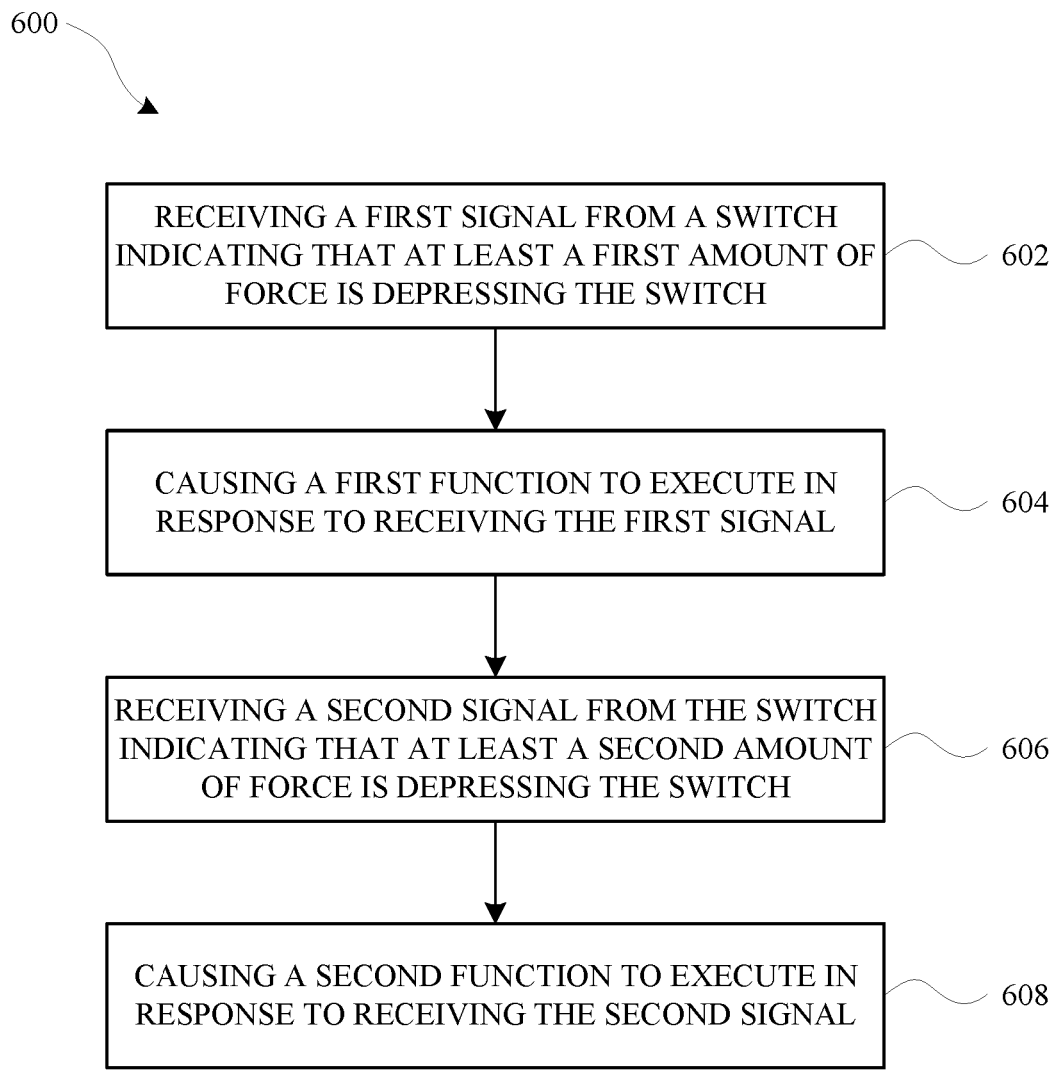
FIG. 6 illustrates a method for performing different functions based on a signal received from the switches discussed herein.

FIG. 6 illustrates a method 600 for executing functions of a computing device using the switch 110. The method 600 can be performed by any device, apparatus, or computing device suitable for being controlled by a switch. The method 600 can include a step 602 of receiving a first signal from a switch, the first signal being indicative of at least a first amount of force depressing the switch. The method 600 can further include a step 604 of causing a first function to execute in response to receiving the first signal. The first function can be any function of a computing device that can be controlled by a switch. Additionally, the method 600 can include a step 606 of receiving a second signal from the switch indicative of at least a second amount of force depressing the switch. The second amount of force can be greater than or equal to the first amount of force. Furthermore, the method 600 can include a step 608 of causing a second function to execute in response to receiving the second signal. The second function can be different than the first function and can also be any function of a computing device that can be controlled by a switch.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data, which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A computing device comprising:
a housing capable of carrying:
a logic circuit; and
a switch assembly connected to the logic circuit and capable of completing different electrical connections to the logic circuit that activate different functions of the logic circuit, the switch assembly comprising:
 a first switch having a first convex flexible membrane, the first switch having a first activation characteristic corresponding to a first amount of force required to collapse the first convex flexible membrane; and
 a second switch having a second convex flexible membrane, the second switch having a second activation characteristic corresponding to a second amount of force, different than the first amount of force, required to collapse the second convex flexible membrane,
 wherein the second convex flexible membrane is arranged in a direction opposite the first convex flexible membrane.

2. The computing device of claim 1, wherein the logic circuit is connected to a keyboard of the computing device, and the switch assembly is connected to a key of the keyboard.

3. The computing device of claim 1, wherein when an applied force to the switch assembly is in between the first amount of force and the second amount of force, a collapsed first convex flexible membrane completes a first electrical connection to the logic circuit, and wherein when the applied force is larger than the second amount of force, a collapsed second convex flexible membrane completes a second electrical connection to the logic circuit.

4. The computing device of claim 1, wherein the first convex flexible membrane and the second convex flexible membrane have different surfaces areas.

5. The computing device of claim 1, wherein each of the two convex flexible membranes includes a surface contact that is located at an apex of the convex flexible membrane.

6. The computing device of claim 1, wherein the switch assembly is connected to a track pad of the computing device.

7. The computing device of claim 1, wherein the switch assembly is capable of initializing a sleep mode and an off mode of the computing device.

8. The computing device of claim 1, wherein the switch assembly further comprises a third switch arranged in parallel with the first switch and the second switch.

9. A system comprising:
a logic circuit; and
a switch assembly connected to the logic circuit and comprising (i) a first switch plate carrying a first flexible membrane that has a first convex surface and that is collapsible when a force that exceeds a first threshold level is applied to the first switch plate, and (ii) a second switch plate carrying a second flexible membrane that has a second convex surface and that is collapsible when the force exceeds a second threshold level lower than the first threshold level, the first and second flexible membranes being connected together and arranged such that the first and second convex surfaces face opposite directions,
wherein the first and second flexible membranes are connected so as to transfer at least some of a force of pressure each other such that, when a force that is between the first and second threshold levels is applied to the first switch plate, the second flexible membrane is capable of being collapsed before the first flexible membrane collapses.

10. The system of claim 9, wherein the switch assembly further comprises a third flexible membrane arranged in series with the first and second flexible membranes.

11. The system of claim 9, wherein the switch assembly further comprises a third flexible membrane arranged in parallel with the first and second flexible membranes.

12. The system of claim 9, wherein the first flexible membrane carries a first surface contact and the second flexible membrane carries a second surface contact that is connected with the first surface contact.

13. The system of claim 9, wherein the first switch plate carries a first terminal contact that serves as a first switch that is capable of completing a first electrical connection of an electrical circuit that connects the logic circuit and the switch assembly and the second switch plate carries a second terminal contact that serves as a second switch that is capable of completing a second electrical connection of the electrical circuit.

14. A switch capable of communicating with a logic circuit, the switch comprising:
a switch body, a first switch plate and a second switch plate cooperating to define an internal cavity of the switch, the first switch plate being across the internal cavity from the second switch plate;
a first flexible membrane connected to and extended from the first switch plate, the first flexible membrane having a first convex surface that defines a first apex, the first flexible membrane configured to create a first conductive pathway to the logic circuit when the first flexible membrane is depressed; and
a second flexible membrane connected to and extended from the second switch plate, the second flexible membrane having a second convex surface that defines a second apex the first flexible membrane configured to create a second conductive pathway when the second flexible membrane is depressed,
wherein the first convex surface and the second convex surface face opposite directions and the first and second apexes are connected together such that the first and second flexible membranes are capable of transferring at least some of an applied force of pressure to each other.

15. The switch of claim 14, wherein the first flexible membrane carries a first surface contact is located at the first apex and the second flexible membrane carries a second surface contact is located at the second apex, and the first surface contact is connected to the second surface contact.

16. The switch of claim 14, wherein the first flexible membrane and the second flexible membrane are connected such that a force of pressure applied to one of the first switch plate or the second switch plate is capable of being exerted simultaneously on both the first flexible membrane and the second flexible membrane.

17. The switch of claim 14, further comprising a third flexible membrane that is arranged in parallel with at least one of the first flexible membrane or the second flexible membrane.

18. The switch of claim 14, wherein the first flexible membrane and the second flexible membrane are each collapsible at different forces of pressure.

19. The switch of claim 14, wherein the first flexible membrane and the second flexible membrane are formed from elastic materials configured to consecutively provide at least two feedback forces to a user when the first flexible membrane and the second flexible membrane are depressed by the user.

20. The switch of claim 14, further comprising a third flexible membrane that is arranged in series with both the first flexible membrane and the second flexible membrane.

* * * * *